United States Patent
Hwang et al.

(10) Patent No.: US 7,839,630 B2
(45) Date of Patent: Nov. 23, 2010

(54) HEAT DISSIPATION DEVICE AND COMPUTER USING SAME

(75) Inventors: Ching-Bai Hwang, Taipei Hsien (TW); Jin-Gong Meng, Shenzhen (CN); Cheng-Jen Liang, Taipei Hsien (TW)

(73) Assignees: Furui Precise Component (Kunshan) Co., Ltd., KunShan, Jiangsu Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 1 day.

(21) Appl. No.: 12/396,481

(22) Filed: Mar. 3, 2009

(65) Prior Publication Data

US 2010/0073864 A1    Mar. 25, 2010

(30) Foreign Application Priority Data

Sep. 24, 2008    (CN) .................. 2008 1 0304629

(51) Int. Cl.
G06F 1/20    (2006.01)
H05K 7/20    (2006.01)

(52) U.S. Cl. .................. 361/679.47; 361/679.52; 361/679.54; 361/703; 361/704; 361/709; 165/80.5; 165/104.33; 165/185; 174/15.2; 174/16.3

(58) Field of Classification Search .......... 361/679.46, 361/679.48, 679.52, 679.54, 694, 695, 697, 361/699–700, 702–704; 165/80.2–80.5, 165/104.33, 185; 174/15.2, 16.1, 16.3
See application file for complete search history.

(56) References Cited

U.S. PATENT DOCUMENTS

| 4,636,425 | A | * | 1/1987 | Johnson et al. ............ 428/198 |
| 5,510,954 | A | * | 4/1996 | Wyler .................... 361/679.54 |
| 6,351,382 | B1 | * | 2/2002 | Nakanishi et al. .......... 361/700 |
| 6,570,086 | B1 | * | 5/2003 | Shimoji et al. ............. 174/377 |
| 6,859,364 | B2 | * | 2/2005 | Yuasa et al. ............ 361/679.54 |
| 6,880,626 | B2 | * | 4/2005 | Lindemuth et al. ..... 165/104.26 |
| 7,292,441 | B2 | * | 11/2007 | Smalc et al. ................ 361/704 |
| 7,606,036 | B2 | * | 10/2009 | Hwang et al. .............. 361/719 |
| 7,637,632 | B2 | * | 12/2009 | Wang et al. ................ 362/294 |
| 7,663,883 | B2 | * | 2/2010 | Shirakami et al. .......... 361/700 |
| 2005/0036290 | A1 | * | 2/2005 | Yang et al. ................. 361/704 |
| 2005/0168941 | A1 | * | 8/2005 | Sokol et al. ................ 361/688 |
| 2005/0180113 | A1 | * | 8/2005 | Shirakami et al. .......... 361/704 |
| 2007/0068659 | A1 | * | 3/2007 | Hwang et al. .............. 165/121 |
| 2007/0272395 | A1 | * | 11/2007 | Hwang et al. ......... 165/104.33 |
| 2008/0151503 | A1 | * | 6/2008 | Aapro et al. ................ 361/714 |
| 2009/0044927 | A1 | * | 2/2009 | Hwang et al. .............. 165/80.3 |
| 2010/0127301 | A1 | * | 5/2010 | Chen .......................... 257/99 |

FOREIGN PATENT DOCUMENTS

| JP | 11202978 A | * | 7/1999 |
| JP | 2009115396 A | * | 5/2009 |
| WO | WO 2008043206 A1 | * | 4/2008 |

* cited by examiner

*Primary Examiner*—Robert J Hoffberg
(74) *Attorney, Agent, or Firm*—Frank R. Niranjan

(57) ABSTRACT

A heat dissipation device includes a fin unit, a heat spreader and a heat isolation layer. The heat spreader contacts the fin unit and transfers heat to the fin unit for dissipation. The heat isolation layer is coated on an outer surface of the heat dissipation device. The heat isolation layer is polyurethane foam.

14 Claims, 5 Drawing Sheets

HEAT DISSIPATION DEVICE AND
COMPUTER USING SAME

BACKGROUND

1. Technical Field

The disclosure relates to heat dissipation, and particularly to a heat dissipation device for a laptop computer.

2. Description of Related Art

Electronic components in portable electronic apparatus, such as a laptop computer, can operate at very high speeds, which can, in turn, generate excessive heat, which can make the electronic components unstable, or even cause damage to the components thereof. Therefore, heat must be removed efficiently to ensure normal operation.

With developments in technology, advanced components such as central processing units (CPUs) and video graphics array (VGA) chips feature increasingly high operating speeds, in addition to recent trends in design of laptop computers emphasizing light weight and compact profile, leaving little internal space for deployment of heat dissipation measures. Effective operation of the heat dissipation devices more often requires that an outer surface of the device be very close to an outer shell of the computer, such as near the keyboard, such that heat absorbed from the electronic components is transferred to the outer shell easily, detrimentally affecting device use.

It is thus desirable to provide a heat dissipation device which can overcome the described limitations.

DETAILED DESCRIPTION OF THE EMBODIMENTS

Figure 1:
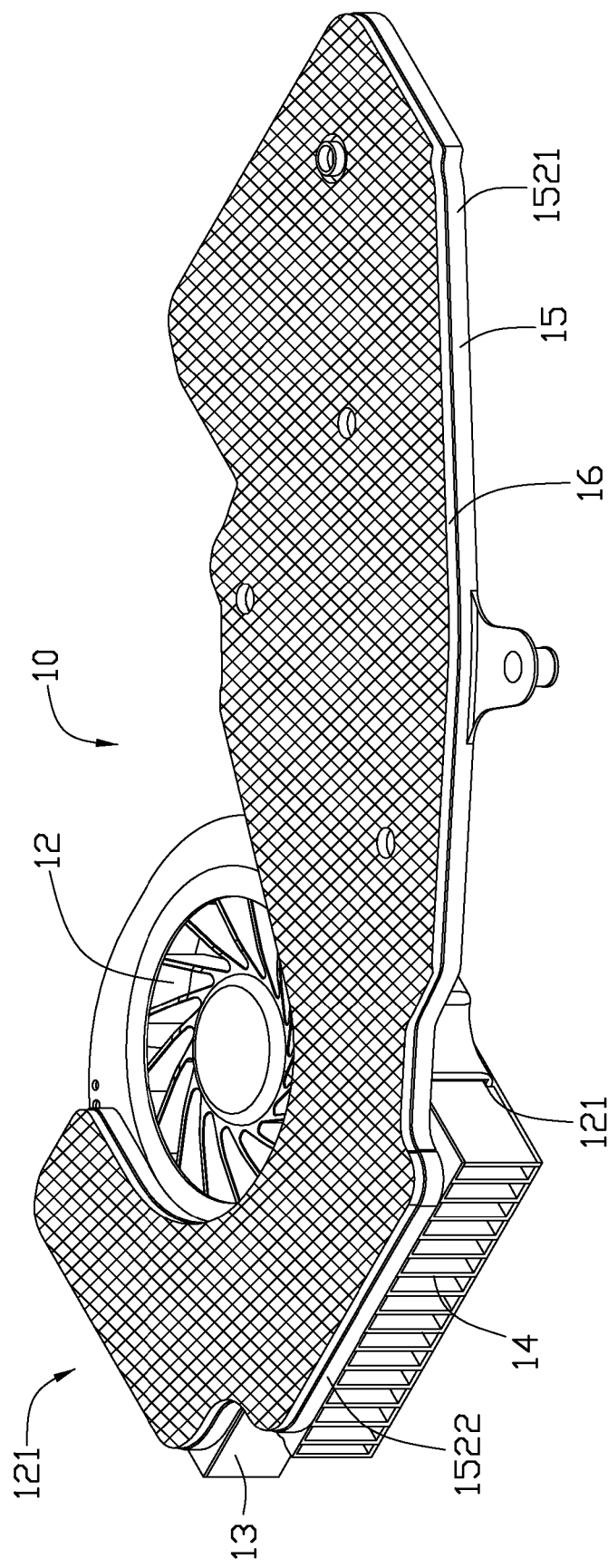
FIG. 1 is an isometric, assembled view of a heat dissipation device according to the disclosure.
Figure 2:
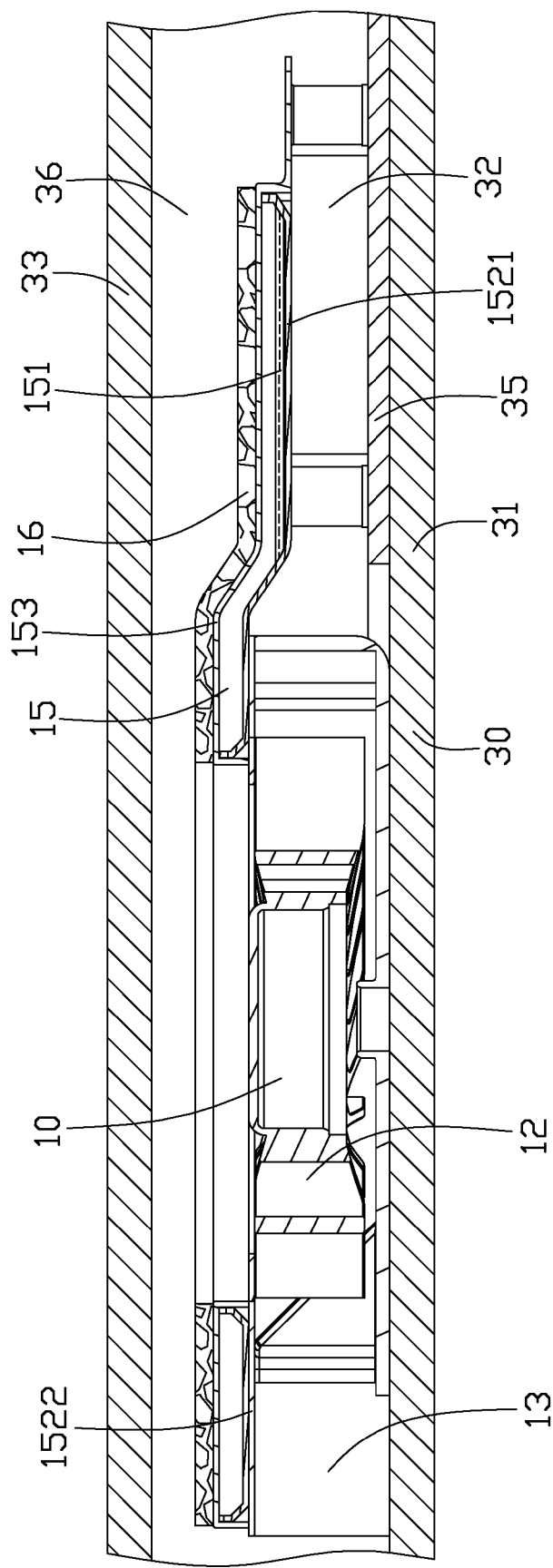
FIG. 2 is a cross-section of the heat dissipation device of FIG. 1 deployed in a laptop computer.

Referring to FIG. 1 and FIG. 2, a heat dissipation device 10 dissipating heat of an electronic component 32 of a laptop computer 30 in accordance with a first embodiment is shown.

The laptop computer 30 includes a bottom cover 31, a printed circuit board 35 and an opposite top cover 33 with a keyboard (not shown) situated thereon. The top and bottom covers 33, 31 are parts of a shell (not labeled) of the laptop computer 30. The bottom cover 31 and the top cover 33 cooperatively form an internal space 36 receiving the printed circuit board 35, the electronic component 32, and the heat dissipation device 10 therein. The internal space 36 is slightly taller than the heat dissipation device 10.

The heat dissipation device 10 includes a heat spreader 15, a centrifugal fan 12, a first fin unit 13, and a second fin unit 14. The centrifugal fan 12 defines first and second air outlets 121 in perpendicular side surfaces thereof, accommodating the first fin unit 13 and the second fin unit 14, respectively. The first and second air outlets 121 are perpendicular. The heat spreader 15 is substantially L-shaped, thermally interconnecting the first and second fin units 13, 14 and the electronic component 32 away from the first and second fin units 13, 14.

Figure 3:
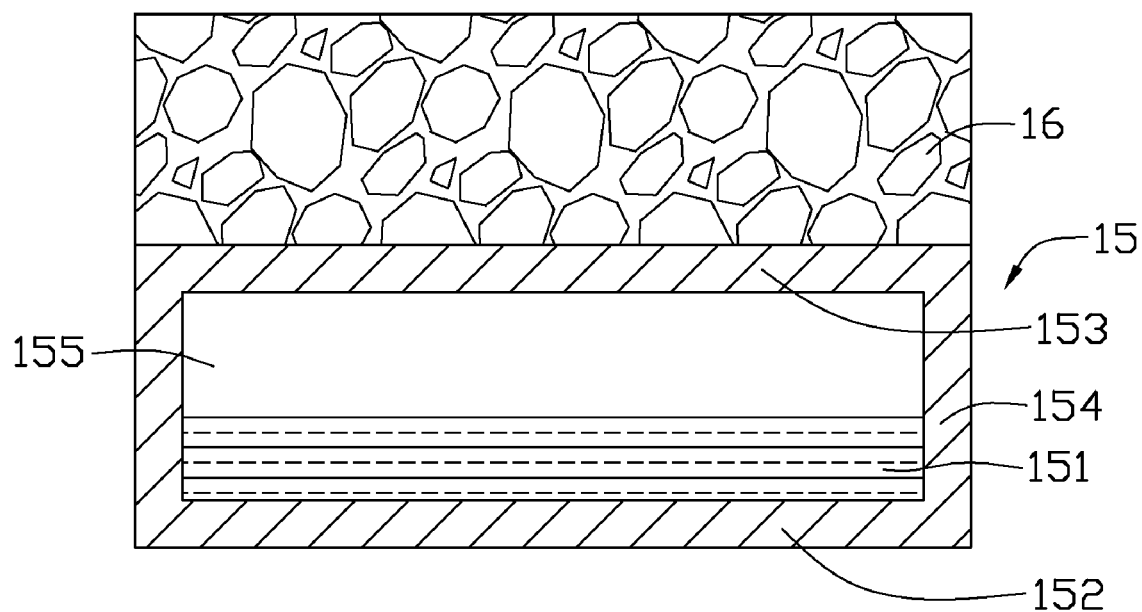
FIG. 3 is a schematic cross-section of a heat spreader of the heat dissipation device of FIG. 1 coated with a heat isolation layer according to a first embodiment.

Also referring to FIG. 3, the heat spreader 15 is a vapor chamber including a bottom wall 152, a top wall 153 parallel thereto, and a sidewall 154 hermetically connecting the top wall 153 and the bottom wall 152. The bottom wall 152, the top wall 153 and the sidewall 154 cooperatively form a sealed space 155 containing a working liquid 151 therein. While, here, the top wall 153, the sidewall 154, and the bottom wall 152 are copper, other materials with equally high thermal conductivity, such as aluminum or its alloys are equally applicable. The bottom wall 152 of the vapor chamber 15 has a first end 1521 (as shown in FIGS. 1 and 2) contacting and absorbing heat from the electronic component 32, and an opposite second end 1522 (as shown in FIGS. 1 and 2) thermally contacting top surfaces of the first and second fin units 13, 14.

A heat isolation layer 16 is coated on the top wall 153 of the vapor chamber 15. The heat isolation layer 16 is polyurethane foam with very low thermal conductivity of only about 0.017 W/(m·K)~0.024 W/(m·K). The heat isolation layer 16 is formed on the entire top wall 153 by electric arc spray coating. During coating, liquid polyurethane is provided, and an electric arc spray gun uniformly atomizes and sprays the liquid polyurethane onto the top wall 153. The sprayed liquid polyurethane cools to form polyurethane foam and thus bonds well to the top wall 153 of the vapor chamber 15.

Referring to FIG. 2 again, the electronic component 32 is located on the printed circuit board 35. The printed circuit board 35 is arranged on the bottom cover 31 of the laptop computer 30. The centrifugal fan 12 and the first and second fin units 13, 14 are located away from the electronic component 32. Bottom surfaces of the first and second fin units 13, 14 face and are adjacent to the bottom cover 31 of the laptop computer 30. The first end 1521 of the bottom wall 152 of the vapor chamber 15 is thermally connected to the electronic component 32, and the second end 1522 of the bottom wall 152 of the vapor chamber 15 is thermally attached to the top surfaces of the first and second fin units 13, 14. The heat isolation layer 16 on the top wall 153 of the vapor chamber 15 faces and is adjacent to the top cover 33 of the laptop computer 30.

During operation, as heat is generated by the electronic component 32 attached to the first end 1521 of the bottom wall 152 of the heat spreader 15, the working fluid contained in the heat spreader 15 absorbs the heat and evaporates into vapor. The vapor spreads quickly, filling the space 155 of the vapor chamber 15, and when the vapor reaches the second end 1522 of the bottom wall 152, the heat spreader 15, thermally contacting the first and second fin units 13, 14, releases the heat to the first and second fin units 13, 14. After the heat is released, the vapor condenses into liquid, which then flows back to the first end 1521 of the heat spreader 15. Since the heat spreader 15 transfers the heat using phase change mechanism involving the working fluid, the heat transferred to the heat spreader 15 from the electronic component 32 is thus rapidly and evenly distributed over the entire heat spreader 15, and then conveyed to the first and second fin units 13, 14 through which the heat is dissipated into an environment outside the laptop computer 30 via openings (not shown) defined in the shell of the laptop computer 30. The centrifugal fan 12 provides airflow through the first and second fin units 13, 14 removing heat therefrom.

Since the heat isolation layer 16 having low thermal conductivity is coated on the entire top wall 153 of the heat spreader 15, heat distributed over the entire heat spreader 15 does not transfer to the top cover 33 of the laptop computer 30, maintaining a lower temperature thereof, especially a keyboard provided thereon. The heat isolation layer 16 is thin enough to satisfy compactness of the laptop computer 30, and is easily formed on any required surface of the heat dissipation device 10 with simple manufacture. For example, the heat isolation layer 16 can be formed on the bottom surfaces of the first and second fin units 13, 14, controlling the temperature of the bottom cover 31, benefiting further use requirements.

Figure 4:
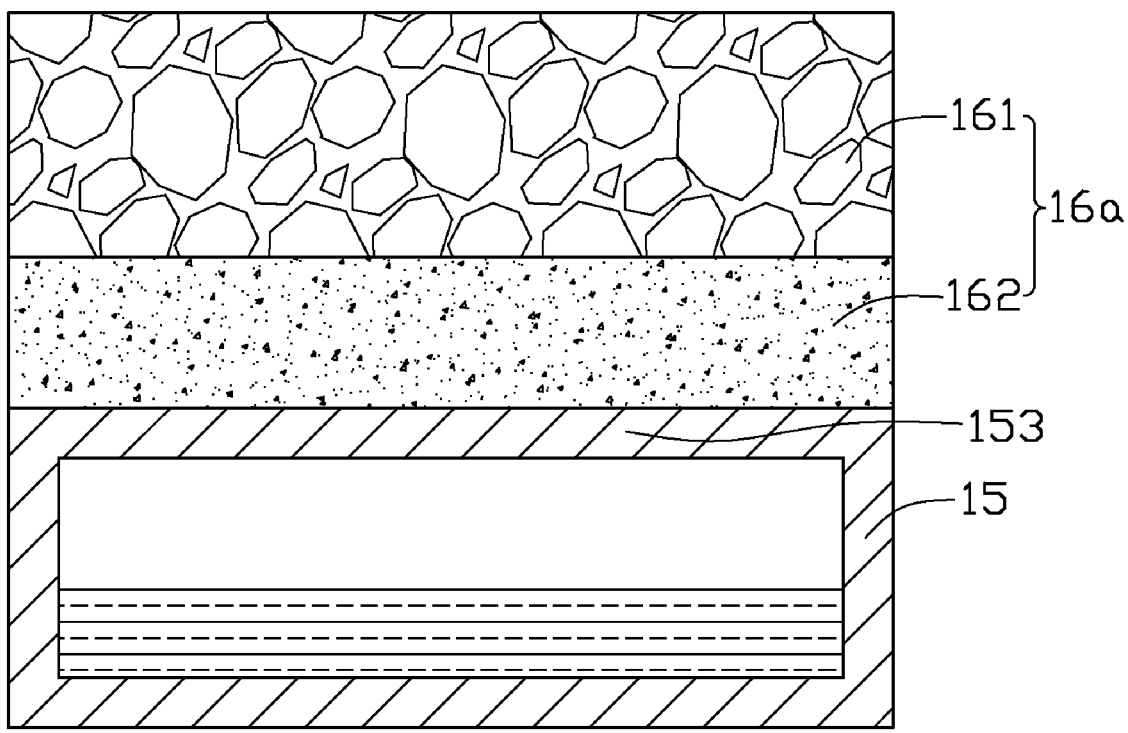
FIG. 4 is a schematic cross-section of the heat spreader of the heat dissipation device of FIG. 1 coated with a heat isolation layer according to a second embodiment.

FIG. 4 is a schematic cross-section of the heat spreader 15 of the heat dissipation device 10 coated with a heat isolation layer 16a according to a second embodiment. The heat isolation layer 16a includes a sheet of polyurethane rigid foam 161 and an adhesive layer 162 connecting the polyurethane rigid foam 161 with the top wall 153 of the heat spreader 15. The heat isolation layer 16a is formed by cutting a pre-formed polyurethane foam into a thin sheet corresponding in shape and size to top wall 153 of the heat spreader 15, which is then affixed to the top surface of the heat spreader 15 by the adhesive layer 162.

Figure 5:
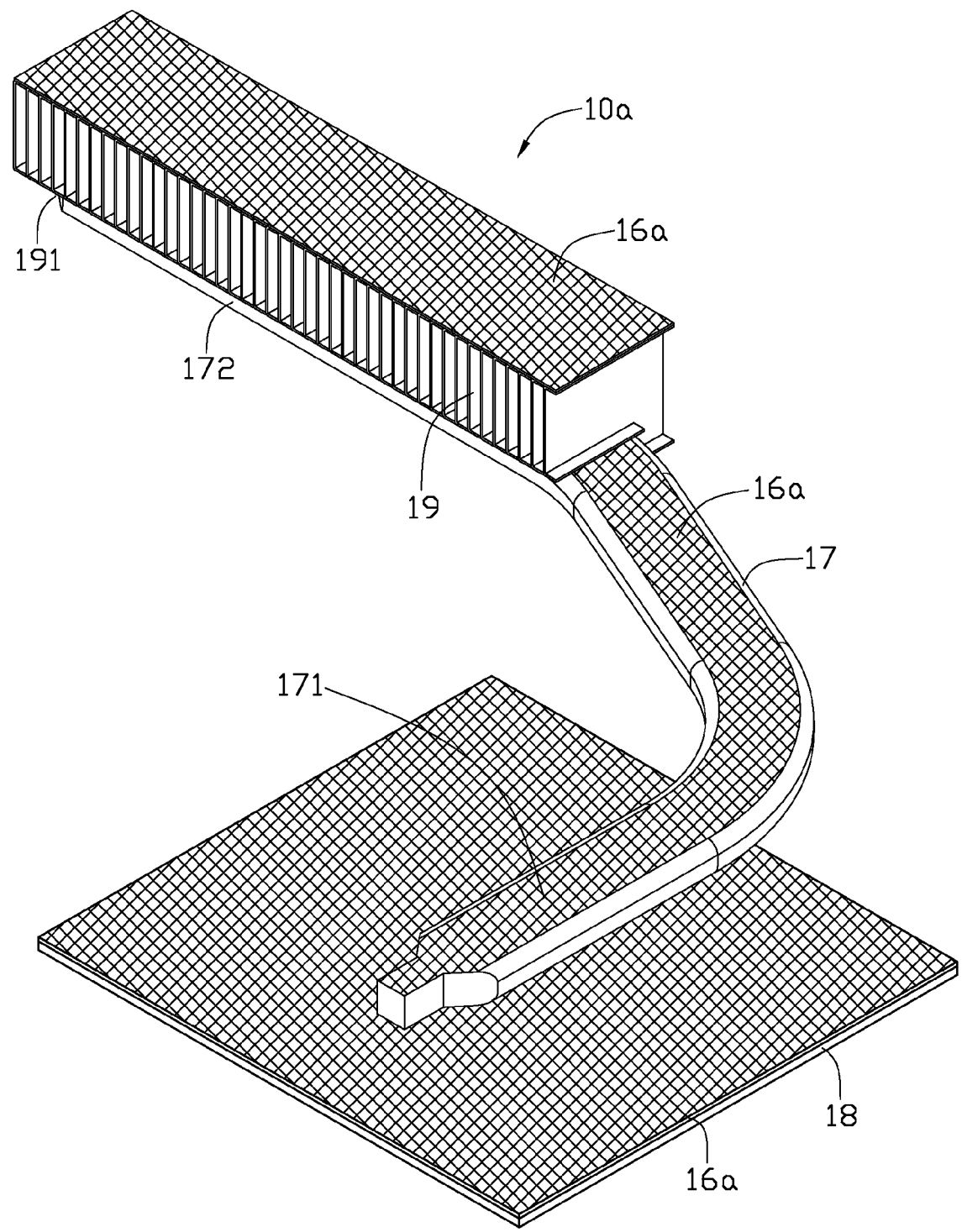
FIG. 5 is an isometric, assembled view of another heat dissipation device incorporating the heat isolation layer of FIG. 4.

FIG. 5 illustrates a heat dissipation device 10a incorporating the heat isolation layer 16a of FIG. 4. The heat dissipation device 10a includes a heat absorbing block 18, a heat spreader 17, and a fin unit 19. In this embodiment, the heat spreader 17 is a heat pipe which forms an evaporating section 171 and a condensing section 172 at two ends thereof, and a cutout 191 defined in a bottom end of the fin unit 19 receiving the condensing section 172 of the heat pipe 17 therein. The heat absorbing block 18 is flat, and includes a top surface attaching to the evaporating section 171 of the heat pipe 17 and an opposite bottom surface thermally attaching to the electronic component 32. The heat pipe 17 is tabular with top and bottom surfaces being planar. The heat isolation layer 16a is coated on the top surface of the heat absorbing block 18 except one portion contacting the evaporating section 171 of the heat pipe 17, the top surface of the heat pipe 17 except one portion that is received in the cutout 191 of the fin unit 19, and the entire top surface of the fin unit 19. That is, the heat isolation layer 16a is coated on the top surface of the heat dissipation device 10a exposed to the internal space 36 of the laptop computer 30 after the heat dissipation device 10a is deployed therein.

It is to be understood, however, that even though numerous characteristics and advantages of the disclosure have been set forth in the foregoing description, together with details of the structure and function of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation device comprising:
    a fin unit;
    a heat absorbing block having a bottom surface adapted for thermally contacting an electronic component;
    a heat spreader contacting the fin unit and transferring heat thereto for dissipation, wherein the heat spreader is a tabular heat pipe, one end of which is arranged on a top surface of the heat absorbing block and adapted for thermally connecting the electronic component, and another end of which is received in the fin unit; and
    a heat isolation layer comprising polyurethane foam, wherein the heat isolation layer is fixedly coated on top surfaces of the fin unit, the heat absorbing block, and the heat pipe.

2. The heat dissipation device of claim 1, wherein the heat isolation layer is formed by spraying a liquid polyurethane onto the outer surface of the heat dissipation device, and then cooling the liquid polyurethane to form the polyurethane foam bonding to the outer surface of the heat dissipation device directly.

3. A computer comprising:
    a top cover;
    a bottom cover opposite to the top cover;
    an electronic component located on the bottom cover; and
    a heat dissipation device received in the computer and located entirely between the top and bottom covers, the heat dissipation device comprising a fin unit and a heat spreader, the heat spreader thermally interconnecting the fin unit and the electronic component, an outer surface of the heat dissipation device facing and adjacent to the top cover, a heat isolation layer being fixedly coated over substantially an entire surface of the heat spreader facing the top cover, and wherein the heat isolation layer comprises polyurethane foam.

4. The computer of claim 3, wherein the heat spreader is a vapor chamber comprising a top wall, a bottom wall parallel to the top wall and a sidewall hermetically interconnecting the top wall and the bottom wall, the top wall, the bottom wall and the sidewall cooperatively forming a sealed space containing a working fluid therein, the top wall facing and adjacent to the top cover of the computer, and the heat isolation layer being coated on the top wall.

5. The computer of claim 4, wherein one end of the bottom wall of the heat spreader thermally contacts the electronic component, and another end of the bottom wall of the heat spreader thermally contacts a top surface of the fin unit.

6. The computer of claim 3, wherein the heat spreader is a tabular heat pipe, a cutout is defined in the fin unit through which the heat pipe extends, a top surface of the fin unit faces and is adjacent to the top cover of the computer, and the heat isolation layer is coated on the top surface of the fin unit.

7. The computer of claim 6, further comprising a heat absorbing block comprising a bottom surface thermally contacting the electronic component, one end of the heat pipe arranged on a top surface of the heat absorbing block, and the heat isolation layer further coated on top surfaces of the heat absorbing block and the heat pipe after the heat absorbing block and the heat pipe are connected together.

8. The computer of claim 3, wherein the heat isolation layer is formed by spraying a liquid polyurethane onto the outer surface of the heat dissipation device, and then cooling the liquid polyurethane to form the polyurethane foam bonding to the outer surface of the heat dissipation device directly.

9. A heat dissipation device for dissipating heat generated by an electronic component in a laptop computer comprising a top cover and a bottom cover, the heat dissipation device located entirely between the top and bottom covers, comprising:
    a heat spreader having a first portion for thermally connecting with the electronic component to absorb the heat therefrom and a second portion;
    a fin unit thermally connecting with the second portion of the heat spreader for dissipating the heat away from the heat spreader; and
    a heat isolation layer fixedly coated over substantially an entire surface of the heat spreader which faces and is adjacent to the top cover of the laptop computer when the heat dissipation device is deployed in the laptop computer.

10. The heat dissipation device of claim 9, wherein the heat isolation layer is made of polyurethane foam.

11. The heat dissipation device of claim 10, wherein the polyurethane foam is directly coated on the surface.

12. The heat dissipation device of claim 10, wherein the polyurethane foam is secured to the surface via an adhesive therebetween.

13. The heat dissipation device of claim 10, further comprising a fan for generating an airflow through the fin unit.

14. The heat dissipation device of claim 13, wherein the fin unit is divided into two perpendicular fin groups.

* * * * *